(12) United States Patent
Nishikawa (10) Patent No.: US 7,571,407 B2
(45) Date of Patent: Aug. 4, 2009

(54) SEMICONDUCTOR INTEGRATED CIRCUIT AND METHOD OF TESTING DELAY THEREOF

(75) Inventor: Tsuyoshi Nishikawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 290 days.

(21) Appl. No.: 11/399,604

(22) Filed: Apr. 7, 2006

(65) Prior Publication Data

US 2006/0241877 A1    Oct. 26, 2006

(30) Foreign Application Priority Data

Apr. 8, 2005    (JP)    ............................. 2005-111846

(51) Int. Cl.
     *G06F 17/50*      (2006.01)
(52) U.S. Cl. ................... 716/6; 716/4; 716/5; 714/700; 714/704; 714/718; 713/401; 713/501; 702/58; 327/210; 327/333
(58) Field of Classification Search ................. 716/4–6; 714/700, 704, 718; 713/401, 501; 702/58; 327/210, 333
See application file for complete search history.

(56) References Cited

U.S. PATENT DOCUMENTS

| 5,510,748 | A | * | 4/1996 | Erhart et al. | ................. | 327/530 |
| 5,566,188 | A | * | 10/1996 | Robbins et al. | ............. | 714/744 |
| 5,825,248 | A | * | 10/1998 | Ozawa | ........................ | 330/267 |
| 6,359,492 | B1 | * | 3/2002 | Hipp | .......................... | 327/333 |
| 6,667,648 | B2 | * | 12/2003 | Stout et al. | .................. | 327/333 |
| 6,720,673 | B2 | * | 4/2004 | Blanco et al. | ................. | 307/64 |
| 6,732,336 | B2 | * | 5/2004 | Nystrom et al. | ................. | 716/1 |
| 6,779,163 | B2 | * | 8/2004 | Bednar et al. | .................. | 716/7 |
| 6,911,855 | B2 | * | 6/2005 | Yin et al. | .................... | 327/210 |
| 7,051,306 | B2 | * | 5/2006 | Hoberman et al. | ............ | 716/6 |
| 7,089,443 | B2 | * | 8/2006 | Albonesi et al. | ............ | 713/501 |
| 7,093,144 | B2 | * | 8/2006 | Skroch | ....................... | 713/300 |
| 7,251,740 | B2 | * | 7/2007 | Newman | .................... | 713/401 |
| 2005/0251775 | A1 | * | 11/2005 | Wood | .......................... | 716/10 |
| 2006/0061401 | A1 | | 3/2006 | Shiratake et al. | | |
| 2007/0011643 | A1 | * | 1/2007 | Wang et al. | .................... | 716/18 |

OTHER PUBLICATIONS

T. Fujiyoshi et al., "An H.264/MPEG-4 Audio/Visual Codec LSI with Module-Wise Dynamic Voltage/Frequency Scaling," IEEE International Solid-State Circuits Conference 2005, 7.3, pp. 132-133 and 589.

* cited by examiner

*Primary Examiner*—Naum B Levin
(74) *Attorney, Agent, or Firm*—Foley & Lardner LLP (57) ABSTRACT

A semiconductor integrated circuit comprises: a first area, formed on a semiconductor chip, which operates at a first predetermined voltage and a first predetermined frequency; a second area, formed on the semiconductor chip, which operates at a second voltage and a second frequency lower than the first voltage and the first frequency, respectively, and also operates after a shift to the first voltage and the first frequency; and a third area, formed on the semiconductor chip, which operates at the first voltage and a frequency which operates the second area and transmits and receives signals sent between the first area and the second area; the third area possessing a delay analysis endpoint that can analyze each of a first delay occurring between the first area and the third area and a second delay occurring between the second area and the third area.

16 Claims, 7 Drawing Sheets

SEMICONDUCTOR INTEGRATED CIRCUIT AND METHOD OF TESTING DELAY THEREOF

CROSS-REFERENCE TO RELATED APPLICATION

The present application is based upon and claims the benefit of priority from Japanese Patent Application No. 2005-111846, filed on Apr. 8, 2005, the entire content of which is incorporated herein by reference.

BACKGROUND

The present application relates to a semiconductor integrated circuit and a method of testing delay of the semiconductor integrated circuit, and more particularly, the present application relates to a semiconductor integrated circuit and a method of testing delay of the semiconductor integrated circuit for making it easy to test delay within circuit that includes an area capable of operating at a predetermined clock frequency (hereinafter referred to as "frequency") and a predetermined voltage and an area capable of operating at frequency and voltage given after shifting among different levels of frequency and different levels of voltage.

Recently, there is being proposed integrated circuit constructed by dividing the interior of semiconductor integrated circuit on a single chip into a plurality of supply voltage and frequency areas and by lowering the level of frequency of area(s) that computes low load tasks accompanied by lowering the level of voltage also of such area(s). That is, this integrated circuit possesses a first area, in which sub-areas, each formed with interior circuits designed to perform various functions, operate at a predetermined frequency and a predetermined voltage, and a second area, which can function at a different level of frequency and a different level of voltage given after shifting among different levels of frequency and different levels of voltage.

Figure 9:
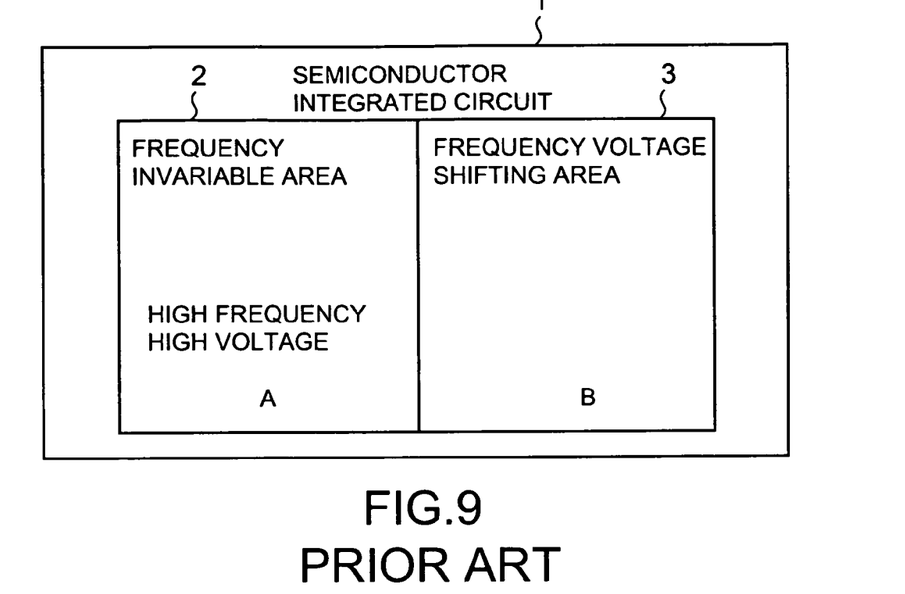
FIG. 9 is a block diagram illustrating a semiconductor integrated circuit according to the prior art.

As shown in FIG. 9, a semiconductor integrated circuit 1 according to the prior art possesses an A-area 2, which may be regarded as an area (a first area) capable of operating at high frequency and high voltage, and a B-area 3, which may be regarded as a frequency and voltage level shift area (a second area) capable of operating not only at the high frequency and high voltage but also at low frequency and low voltage. In this semiconductor integrated circuit 1, the same frequency and voltage as those used to drive the A-area 2 drive the B-area 3 when it computes heavy load tasks, but, when it computes light load tasks, the frequency driving the B-area 3 and even the voltage are lowered for lowering total power consumption. Accordingly, as shown in FIG. 9, according to the prior art, source voltage area and frequency area are divided from each other by indistinguishable boundary, so named because it disappears when these areas operate at high frequency and high voltage.

Figure 10:
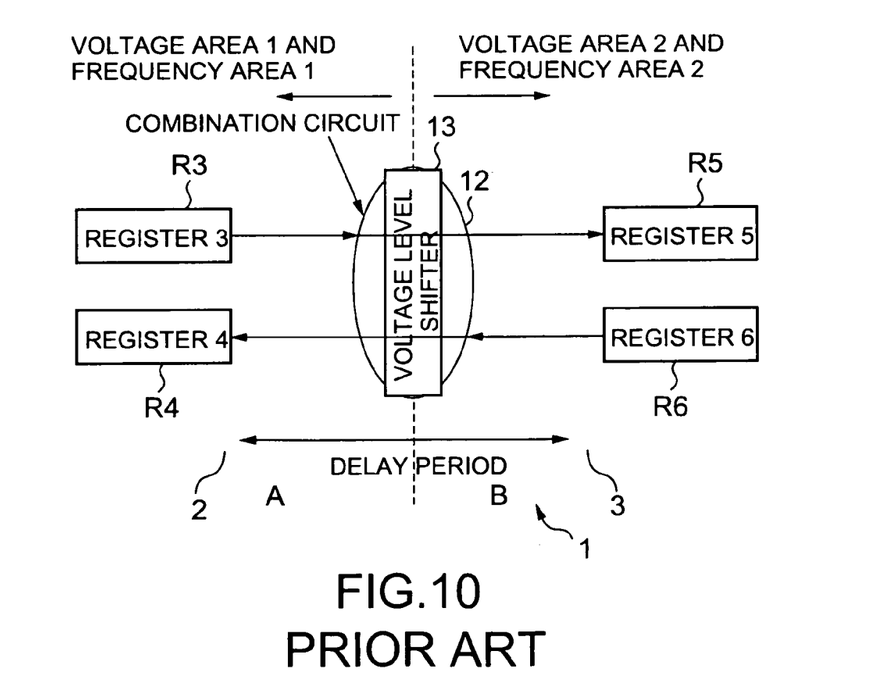
FIG. 10 is a block diagram illustrating another semiconductor integrated circuit according to the prior art.

As a concrete circuit structure of conventional integrated circuit, as shown in FIG. 10, a combination circuit 12 is provided between registers R3, R4 within A-area 2, which is a first supply-voltage area 1 having a high voltage and a first frequency area 1 having a high frequency, and registers R5, R6 within B-area 3, which is a second supply-voltage area 2 capable of shifting between high and low voltages and a second frequency area 2 capable of shifting between high and low frequencies, and it is provided with a voltage level shifter 13 capable of shifting a voltage level from a high voltage level to a low voltage level and from the low voltage level to the high voltage level.

As a delay trouble-shooting test on semiconductor integrated circuit before shipment, there are a delay test employing scan technique and a field delay test without employing scan technique. The delay test is conducted in the following manner. With semiconductor integrated circuit being driven at a frequency for a delay to be tested, a tester in charge of the test sends digital signal to the semiconductor integrated circuit. Concurrently with the sending of digital signal, the inspector observes digital signal outputted by the semiconductor integrated circuit, and judges that an unacceptable delay has occurred somewhere the signal past so that the semiconductor integrated circuit be rated as a sub-standard article if the digital signal outputted from the semiconductor integrated circuit fails to show a predetermined pattern. The delay test using scan technique is advantageous in that the signal propagation path is easy to specify, making it easy to find where the degraded portion is. However, it is required that all the circuits within an area where the scan is applied be driven at the same frequency. The field delay test without relying on the scan technique is disadvantageous in that the signal propagation path is difficult to specify, making it difficult to find where the degraded portion is if signal outputted from the semiconductor integrated circuit fails to show a predetermined pattern. Conducting the above-mentioned conventional test (delay tests) of semiconductor integrated circuit at the time of shipment will necessarily require testing delay over a delay period between the resistors R3, R4 on the A-area 2 side to define one end of the delay period, and resistors R5, R6 on the B-area 3 side to define the opposite end of the delay period. Tests, performed upon assuming conditions that A-area 2 and B-area 3 are driven at the same frequency, can take the same procedure as the conventional ordinary test of semiconductor integrated circuit requiring no shifting among frequency and voltage.

However, tests, performed upon assuming conditions that, after shifting between different levels of frequency and voltage for B-area 3, different frequency and different voltage from those driving A-area 2 are used to drive B-area, will necessarily require testing delay across a path bridging the A and B-areas against each of all possible combinations of different levels of frequency and voltage needed as an test at the time of shipment, making it necessary to design circuits tough enough to withstand use under each of the all possible combinations of different levels of frequency and voltage.

As mentioned above, the conventional semiconductor integrated circuit, when the first and second areas are driven at different levels of frequency and different levels of source voltage, requires different test vectors for testing delay along signal path bridging frequency and voltage areas, posing a problem of increased time and labor needed for an test at the time of shipment for mass production.

SUMMARY

According to one aspect of the present application, a semiconductor integrated circuit comprises: a first area, formed on a semiconductor chip, which operates at a first predetermined voltage and a first predetermined frequency; a second area, formed on the semiconductor chip, which operates at a second voltage and a second frequency lower than the first voltage and the first frequency, respectively, and also operates after a shift to the first voltage and the first frequency; and a third area, formed on the semiconductor chip, which operates at the first voltage and a frequency which operates the second area and transmits and receives signals sent between the first area and the second area; the third area possessing a delay analysis endpoint that can analyze each of a first delay occurring between the first area and the third area and a second delay occurring between the second area and the third area.

According to another aspect of the present application, there is provided a method of testing delay of a semiconductor integrated circuit, applied to a semiconductor integrated circuit including a first area, formed on a semiconductor chip, which operates at a first predetermined voltage and a first predetermined frequency; and a second area, formed on the semiconductor chip, which operates at a second voltage and a second frequency lower than the first voltage and the first frequency, respectively, and also operates after a shift to the first voltage and the first frequency; the method comprising: providing a third area, formed on the semiconductor chip, which operates at the first voltage and a frequency which operates the second area and transmits and receives signals sent between the first area and the second area; providing beforehand, within the third area, a delay analysis endpoint that can analyze each of a first delay occurring between the first area and the third area and a second delay occurring between the second area and the third area; and performing a delay test by detecting the first delay and the second delay with the delay analysis end point.

DESCRIPTION OF THE EMBODIMENTS

Referring to the accompanying drawings, embodiments of a semiconductor integrated circuit according to the present application and a method of testing delay of the semiconductor integrated circuit are described in detail. The same reference numerals as those used in FIGS. 9 and 10 are used to denote like or equivalent constituent elements.

First Embodiment

Figure 1:
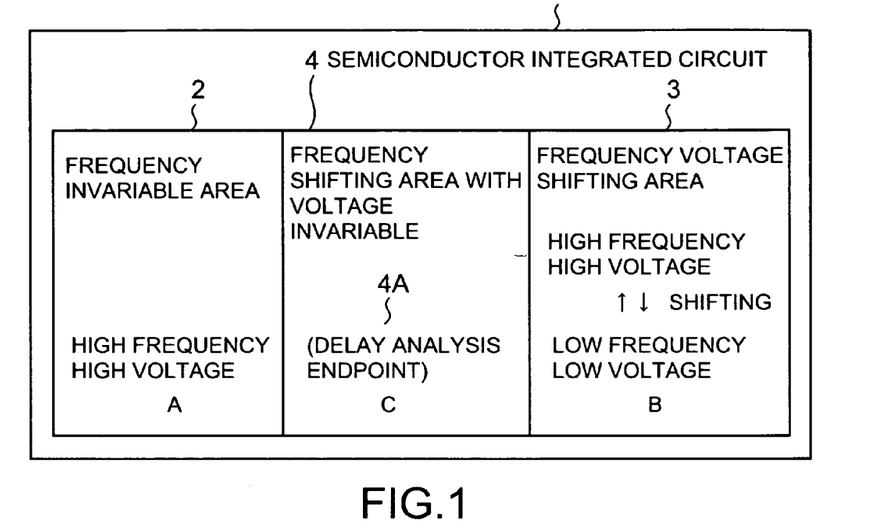
FIG. 1 is a block diagram illustrating a semiconductor integrated circuit according to a first embodiment.

FIG. 1 illustrates constituent elements of a first embodiment of a semiconductor integrated circuit. In FIG. 1, the semiconductor integrated circuit 1 possesses an A-area 2, which is formed on a single chip and may be regarded as a first (1st) area that operates at a first voltage (high voltage) and a first (1st) frequency (high frequency); a B-area 3, which is formed on the same single chip and may be regarded as a second (2nd) area that operates not only at a second (2nd) voltage (low voltage) lower than the first voltage and a second (2nd) frequency (low frequency) lower than the first frequency, but also at the first voltage (high voltage) and the first frequency (high frequency); a C-area 4, which is provided between the first and second areas and may be regarded as a third area, an intermediate area, that operates at the first voltage (high voltage) and a frequency which operates the second area; and delay analysis endpoint 4A, which are provided within the C area 4 regarded as the third area and capable of analyzing a first delay occurring between the A-area 2 and C-area 4 on the way along the paths of signal transmitted between the A-area 2 and B-area 3 and a second delay occurring between the B-area 3 and C-area 4 on the way along the signal paths.

According to the first embodiment of semiconductor integrated circuit 1, as compared to the conventional example shown in FIG. 9, the C-area 4, which shifts between different levels of frequency with voltage kept constant, is disposed between the A-area 2 with the frequency and voltage kept constant and the B-area 3 shifting between different levels of frequency and voltage, and it is connected between them using the following technique. The A-area 2 and C-area 4 are all capable of operating at the same high voltage, the C-area 4 is capable of operating at the first frequency, which is equal to the frequency of the A-area 2 kept always at the high frequency, or the second frequency lower than the first frequency, and the C-area 4 and A-area 2 are synchronized in frequency before the C-area 4 shifting from the first to the second frequency and after the C-area 4 shifting from the second to the first frequency.

The voltage of the B-area 3 is the first voltage, which is equal to the voltage of the C-area 4, or the second voltage lower than the first voltage. The C-area 4 and B-area 3 can shift alike in frequency and are synchronized in frequency even before and after the B-area 3 shifting between the first and second voltage. When they are at the first voltage, the C-area 4 and B-area 3 have the same frequency as high as the first frequency of the A-area 2. On the one hand, when the B-area 3 is at the second voltage, the C-area 4 and B-area 3 both have the second frequency lower than the frequency of the A-area 2 kept always at the first frequency. Here, setting the C-area 4 to operate at the lower second frequency brings about the realization of reduced total power consumption.

Wires for transmission of signals from the A-area 2 to the B-area 3 and wires for transmission of signals from the B-area 3 to the A-area 2 are routed through the delay analysis endpoint 4A disposed within the C-area 4. Utilizing the delay analysis endpoint 4A has made it possible to carry out design and analysis of signal routing after distinguishing signal routing extending over a frequency area from signal routing extending over a supply-voltage area as different from the conventional case in which there was a need for design and test on signal routing extending over the frequency area and the supply-voltage area simultaneously.

For convenience' sake, the first voltage is used to mean a high voltage and the second voltage a low voltage. Moreover, the first frequency is used to mean a high frequency and the second frequency a low frequency. The next second embodiment shows a concrete example of constitution of the delay analysis endpoint shown in FIG. 1.

Second Embodiment

Figure 2:
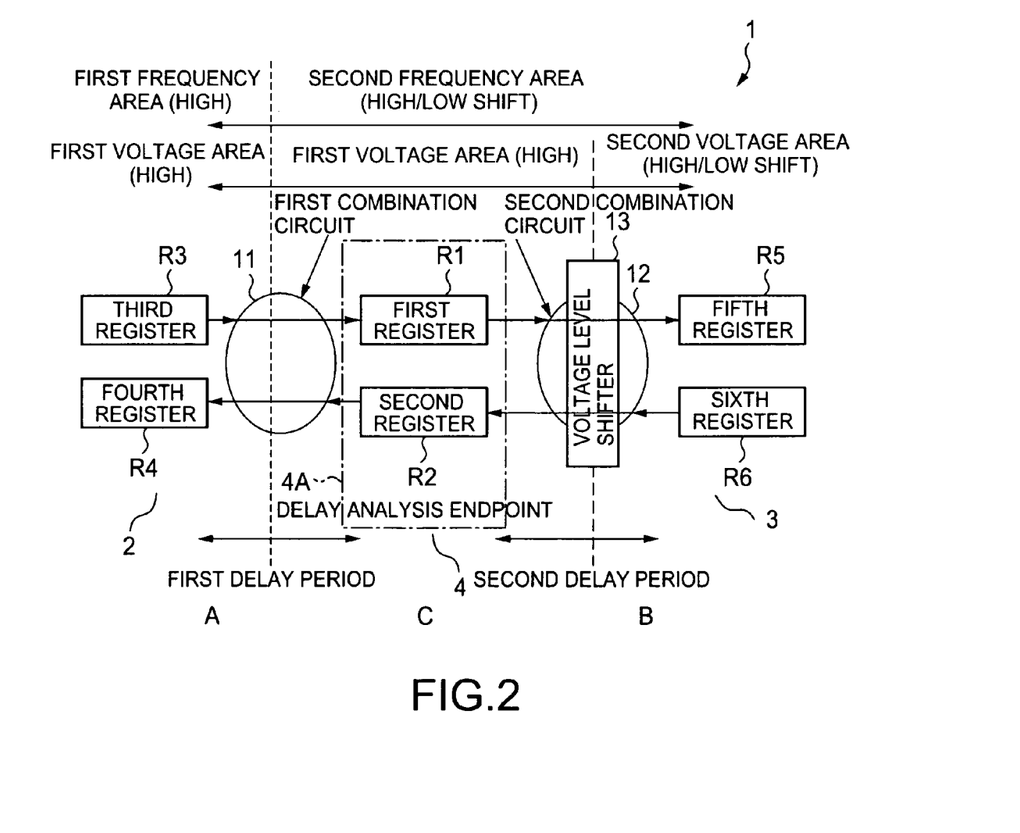
FIG. 2 is a block diagram illustrating a semiconductor integrated circuit according to a second embodiment.

Referring to FIG. 2 showing the second embodiment of a semiconductor integrated circuit, the semiconductor integrated circuit 1 shown in FIG. 1 possesses, as delay analysis endpoint in each of the areas, memory elements called a flip-flop or a latch, namely, first, second, third, fourth, fifth and sixth registers R1, R2, R3, R4, R5 and R6. Within the C-area 4, the first and second registers R1 and R2 are used as the delay analysis endpoint 4A.

In FIG. 2, a first combination circuit 11 is provided between an A-area 2 and a C-area 4, a second combination circuit 12 is provided between a B-area 3 and the C-area 4, and signals are inputted to and outputted from each of the areas through the associated one of the combination circuits. A first delay period is provided between the third and fourth-registers R3, R4 within the A-area 2 and the first and second registers R1, R2 with the C-area 4, and a second delay period is provided between the fifth and sixth registers R5, R6 within the B-area 3 and the first and second registers R1, R2 within the C-area 4.

According to this design technique, interconnection paths are such that all of paths for signals are always routed through the registers within the C-area 4 because there is no circuit that directly combines inputs and outputs of the registers within the A-area 2 with inputs and outputs of the registers within the B-area 3. In FIG. 2, a voltage level shifter 13 represents collectively a set of a plurality of elements for making a shift from a voltage signal within the C-area 4 having a high voltage into a voltage signal for the B-area 3 and the reverse shift.

In the case where this design technique is applied, as the A-area 2 and C-area 4 are always operating at high voltage, testing delay across the first delay period between the A-area 2 and C-area 4 against the high voltage only is enough, reducing cost needed for an test at the time of shipment as compared to the conventional case where it was needed to test delay against various combinations of frequencies with different voltages. Besides, there is nothing for a circuit designer to consider but interconnections at different frequencies upon designing the paths, thus accomplishing an easy circuit design.

Further, with the B-area 3 and C-area 4 operating at the same frequency, testing delay across the second delay period between the B-area 3 and C-area 4 based on consideration of a combination of different voltages only is enough, reducing cost needed for an test at the time of shipment as compared to the conventional case where it was needed to test delay against combinations of different, high and low, frequencies between the A-area 2 and B-area 3 with different voltages between them. Besides, there is nothing for a circuit designer to consider but interconnections at different voltages with the B-area 3 and C-area 4 operating at low frequency upon designing the paths, thus accomplishing an easy circuit design.

That is, since, according to the second embodiment, the third area (C-area 4) of shifting between high and low frequencies at a high voltage is provided between the first area (A-area 2) having a high voltage and a high frequency and the second area (B-area 3) of shifting between frequencies and also between voltages, and the third area (C-area 4) is provided with the first and second registers R1 and R2 as the delay analysis endpoint 4, delay test between the A-area 2 and C-area 4 having the same voltage level kept at a high constant voltage is accomplished only by performing delay test against the high voltage. Further, since the B-area 3 and C-area 4 always have the same level of low frequency and the same phase, it is enough to perform delay test based on consideration of a combination of different voltages.

Third Embodiment

Figure 3:
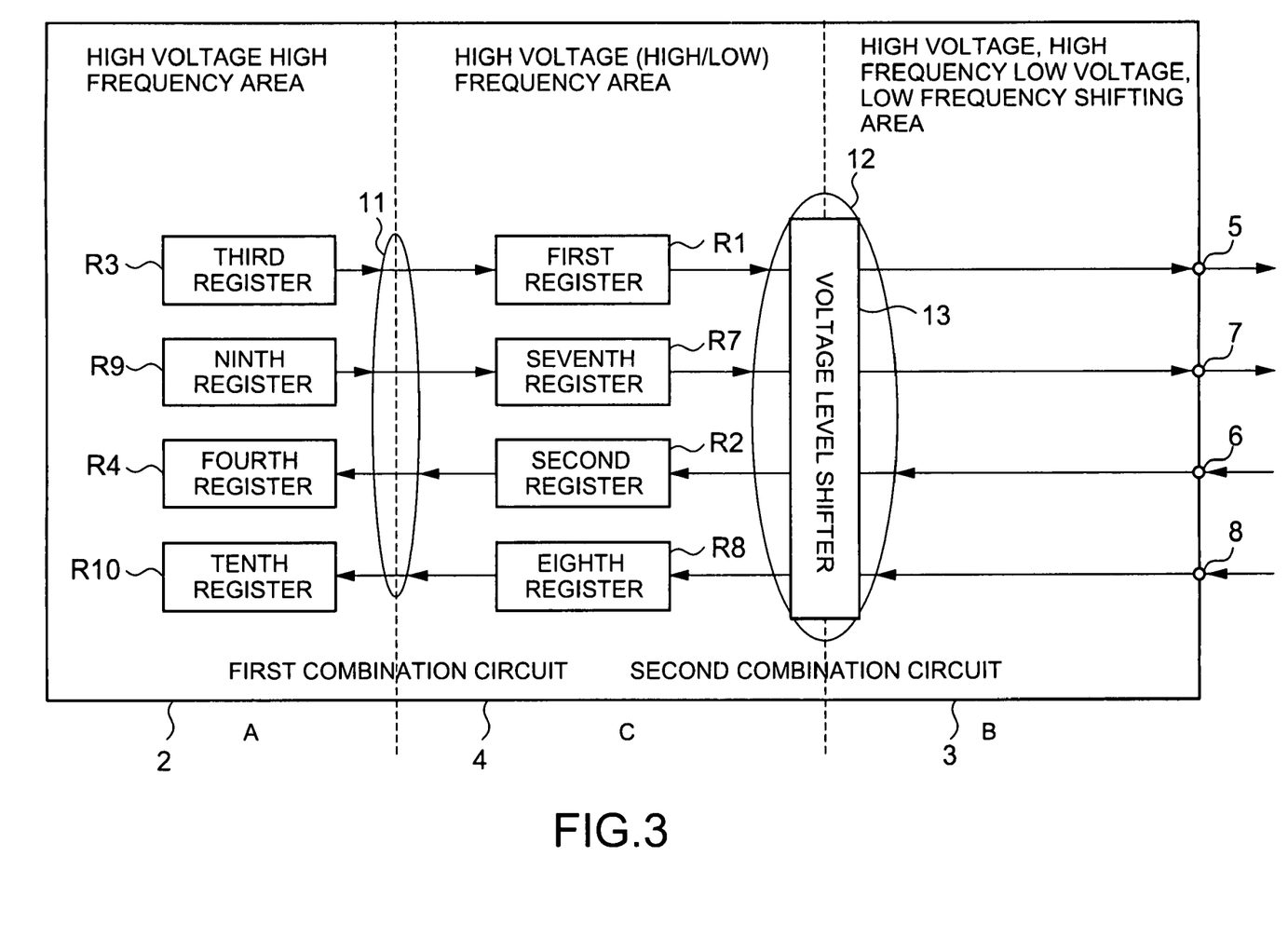
FIG. 3 is a block diagram illustrating an interface circuit according to a third embodiment.

As shown in FIG. 3, the third embodiment, which is employed as an interface circuit of a bus or the like, possesses such construction that registers, which are areas capable of shifting between high and low frequencies at a high voltage, provided within a C-area 4 are arranged with respect to frequency switching terminals provided within a B-area 3. FIG. 3 shows the case involving a voltage level shifter 13 along with a combination circuit 12 at the boundary between the B-area 3 and C-area 4. As one aspect of the present application involves a large number of registers within the C-area 4 oriented in one or the opposite direction, although the third embodiment illustrates two pairs of input/output registers within the C-area 4, the present application is not limited to this construction and any desired great number of input/output registers may be provided.

With regard to the construction in detail, first, second, seventh and eighth registers R1, R2, R7 and R8 are provided within the C-area 4, third, fourth, ninth and tenth registers R3, R4, R9 and R10 are provided within the A-area 2, a first combination circuit 11 is provided within a first delay period between the registers within the C-area 4 and the registers within the A-area 2, and a second combination circuit 12 and a voltage level shifter 13 are provided between the signal output terminals 5, 7 and signal input terminals 6, 8 within the B-area 3 and the registers within the C-area 4. Generalizing, due to the above-mentioned reason, a greater number of registers may be provided within each of the A-area 2 and C-area 4.

According to the third embodiment, with an optional synchronous circuit, such as, a computing circuit designed, by other, for operation at a single frequency with a single power supply, connected to the input/output terminals 5~8 of the B-area 3, delay test may be performed based on the technique according to the present application utilizing the registers R1, R2, R7 and R8 as the delay analysis endpoint.

Fourth Embodiment

To deal with a case where there is a plurality of optional circuits to be connected to a B-area 3, the fourth embodiment possesses voltage-frequency shifting circuits associated with the plurality of optional circuits, respectively. With regard to the construction in detail, in FIG. 4, there are provided, within an A-area 2, third, fourth, ninth and tenth registers R3, R4, R9 and R10 and other synchronous circuit 19 connected to inputs and outputs of these registers; a C-area 4, as a third area, possesses a C1-area 41 as a first high voltage frequency (high/low) switching area and a C2-area as a second high voltage frequency (high/low) switching area; and a B-area 3, as a second area, possesses a first voltage (high/low) frequency (high/low) switching area 31 and a second voltage (high/low) frequency (high/low) switching area 32. A first interconnection system [A-area 2]-[C1-area 41]-[B1-area 31] and a second interconnection system [A-area 2]-[C2-area 42]-[B2-area 32] are independent from each other, each of the systems having its elements connected by a first combination circuit 11a or a second combination circuit 12a and by a third combination circuit 11b or a fourth combination circuit 12b, without any combination bridging the first and second interconnection systems.

Figure 4:
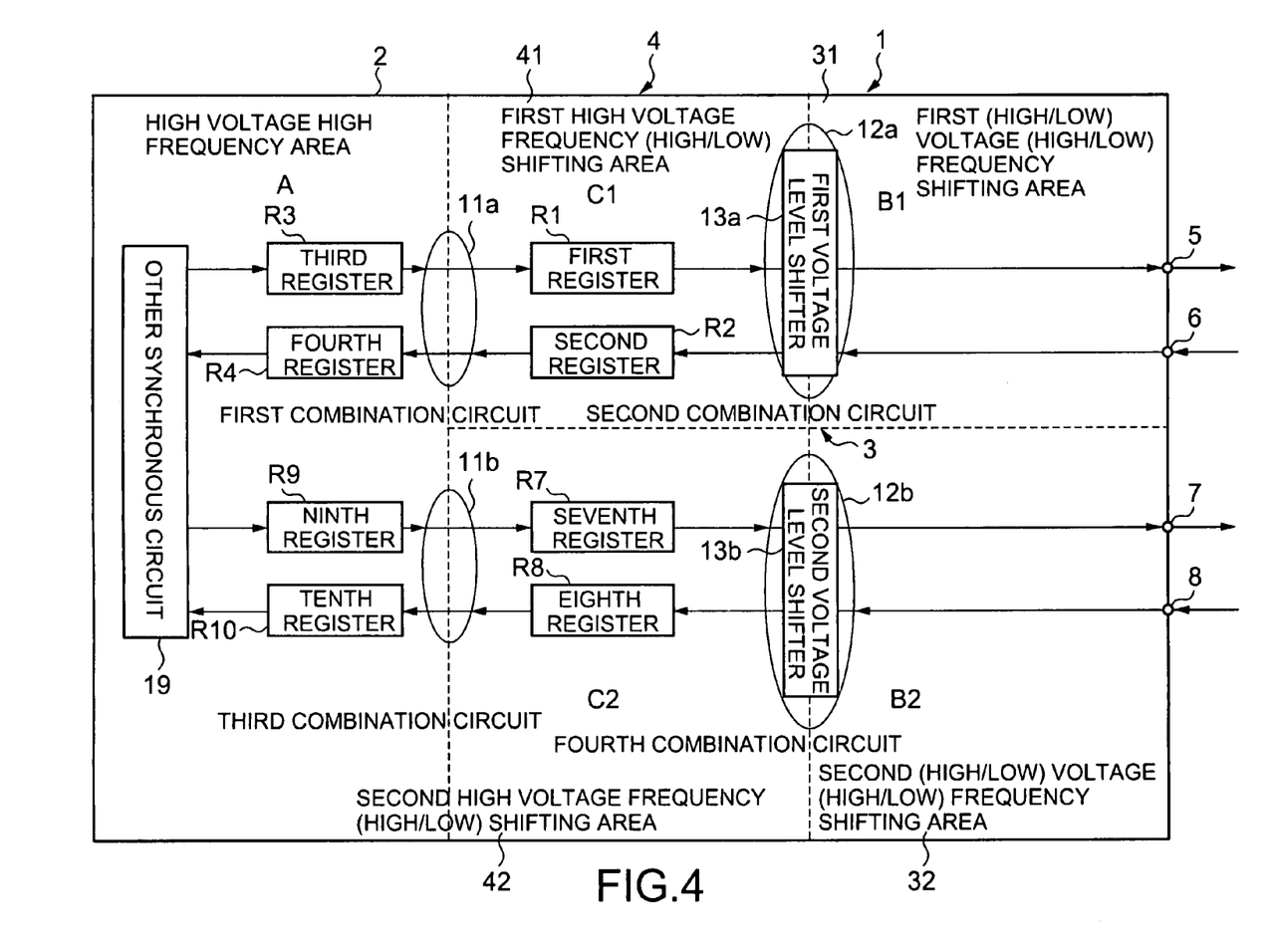
FIG. 4 is a block diagram illustrating an interface circuit for shifting among a plurality of areas.

Further, as shown in FIG. 4, the second and fourth combination circuits 12a and 12b possess a first voltage level shifter 13a and a second voltage level shifter 13b, respectively, the B1-area 31 and B2-area 32 possess signal output terminals 5 and 7, respectively, and also signal input terminals 6 and 8, respectively, and, these input and output terminals 5~8 are used for connecting a plurality of voltage shift frequency shift areas to an interface circuit, such as a bus.

Fifth Embodiment

The fifth embodiment is an example of a delay test performed if, in the second embodiment of semiconductor integrated circuit shown in FIG. 2, all of the areas 2, 3 and 4 operate at high voltage high frequency. Ratio between frequencies are equimultiples, for example, the A-area 2, B-area 3 and C-area 4 all have a frequency of 200 MHz kept constant. With regard to voltage, the A-area 2, B-area 3 and C-area 4 all have 1.5V system. If the setting is such that voltage and frequency of each of the areas 2, 4 and 4 are constant as mentioned above, a delay test of the first combination circuit 11 that is a signal period between the first and second registers R1, R2, as the delay analysis endpoint 4A, and the A-area 2, and a delay test of the second combination circuit 12 that is a signal period between the first and second registers R1, R2, as the delay analysis endpoint 4A and the B-area 3 may be conducted at the same time using a test vector that may be used when the whole is operating at a single frequency. In this case, testing delay against the frequency of 200 MHz at a voltage of 1.5V is enough, reducing cost needed for an test at the time of shipment as compared to the conventional case where it was needed to test delay against combinations of frequencies with different voltages.

Sixth Embodiment

The sixth embodiment is an example of a delay test performed if, in the second embodiment of semiconductor integrated circuit shown in FIG. 2, the B-area 3 operates after having shifted to low frequency low voltage. For example, if the setting is such that the A-area 2 only has 200 MHz, and the B-area 3 and C-area 4 have 100 MHz, the ratio between frequencies is an integer ratio of 1:2. With regard to voltage, the A-area 2 and C-area 4 all have 1.5V, while the B-area 3 only has 1.2V. In this case, an test between the A-area 2 and C-area 4 is conducted under condition that the voltage is fixed at 1.5V to confirm whether the test has been passed by detecting any trouble in the presence of a difference between frequencies, and an test between the B-area 3 and C-area 4 is performed under condition that the frequency is fixed at 100 MHz to confirm whether the test has been passed by detecting any trouble in the presence of a difference between voltages. Further, in the tests under this condition, since the ratio between frequencies does not belong to equimultiples, it is required to use an test vector different from the test vector used in the fifth embodiment.

For a delay test between the B-area 3 and the C-area 4, what is necessary is to perform an test upon consideration of a combination of different voltages of 1.5V for the C-area 4 and 1.2V for the B-area 3 under condition that the B-area 3 and C-area 4 have the same frequency because the B-area 3 and C-area 4 have the same frequency of 100 MHz. As compared to the conventional case where it was needed to test delay against combinations of frequencies with different voltages between the A-area 2 and B-area 3, a reduction in cost needed for an test at the time of shipment is accomplished. In this state, an action test without any shift in frequency and voltage is performed, too.

In other words, according to the sixth embodiment of a method of testing design, what is needed for an test between the first area and the third area is to verify action in the presence of a difference between frequencies with the voltage fixed, and what is needed for an test between the second area and the third area is to verify action in the presence of a difference between voltages with the frequency fixed.

Besides, there is nothing for a circuit designer to consider but interconnections at different voltages when the B-area 3 and C-area 4 have the same frequency upon designing the paths, thus accomplishing an easy circuit design.

Seventh Embodiment

The seventh embodiment is an example of an test performed if, in the second embodiment of semiconductor integrated circuit shown in FIG. 2, the setting is made such that all three areas, including the A-area 2 regarded as the high frequency area, the B-area 3 and C-area 4, have the same frequency of 100 MHz, and the A-area 2 and C-area 4 have a high voltage of 1.5V, while the B-area 3 has a low voltage of 1.2V.

That is, although implementing the sixth embodiment required assumption of a test dealing with different frequencies of 200 MHz and 100 MHz, the seventh embodiment is an embodiment conceived after having an eye to a delay test between the B-area 3 and C-area 4 and has a test conduced with all of the areas driven at the same frequency of 100 MHz. The seventh embodiment is an embodiment to be used jointly with the fifth embodiment such that a delay test between the A-area 2 and the C-area 4 has been performed after passing an test according to the fifth embodiment with the A-area 2, B-area 3 and C-area 4 all having 1.5V and 200 MHz. In this manner, if the delay between the A-area 2 and C-area 4 at 200 MHz is assured, what is left to do is to design the C-area 4 only so that a high frequency coping circuit may be capable of operating upon a drop to 100 MHz.

With the action between the A-area 2 and C-area 4 having been assured, a delay test between the B-area 3 and C-area 4, with an eye on the action test between them, can be performed using the same test vector as used in the fifth embodiment, by lowering the frequencies of all of the areas down for the whole to have a single frequency of 100 MHz. There is an effect that cost needed for test is reduced because a single test vector used in the fifth embodiment may be used if the timing design between the first area and the third area is designed to be capable of coping with high frequency and delay tests over all of the areas are performed at the same frequency.

Eighth Embodiment

The eighth embodiment, in combination with a so-called "scan test", is provided with scan paths put up within first and second areas, respectively. In the above-mentioned seventh embodiment of semiconductor integrated circuit, the A-area 2, B-area 3 and C-area 4 all have the same frequency (taking the seventh embodiment as an example, in one case where the whole has a voltage of 1.5V and a frequency of 200 MHz, and in another case where, with the B-area 3 at a voltage of 1.2V, the whole has a frequency of 100 MHz) to perform test, making it possible to perform an uniform scan test.

Figure 5:
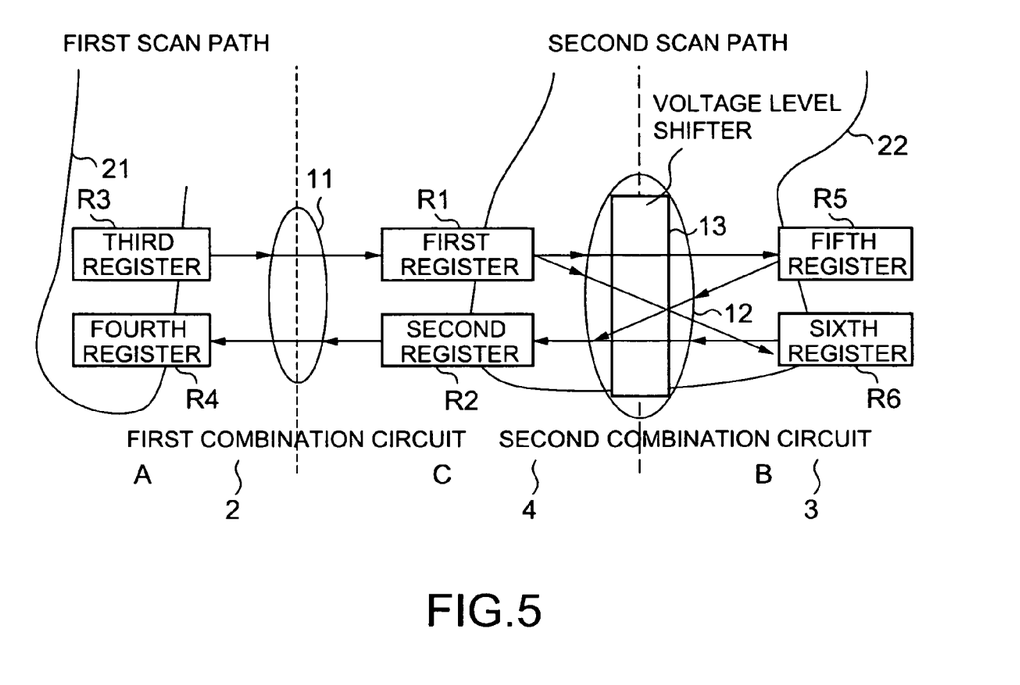
FIG. 5 is a block diagram illustrating one example of delay test according to an eighth embodiment.

In FIG. 5, there are provided a first scan path 21 that includes a third register R3 and a fourth register R4 within an A-area 2 and a second scan path 22 that includes a first register R1 and a second register R2 within a C-area 4 and a fifth register R5 and a sixth register R6 within a B-area 3. Putting up the scan paths 21, 22 in this manner makes it possible to perform a delay test in combination with a scan test.

Putting up a scan path is not limited to the illustrated example in FIG. 5, and the same scan path may be put up over the entire A-area 2, B-area 3 and C-area 4 (via a voltage level shifter 13 when bridging between different voltage areas 2 and 3) or scan paths may be put out within the A-area 2, B-area 3 and C-area 4, respectively.

Ninth Embodiment

Figure 6:
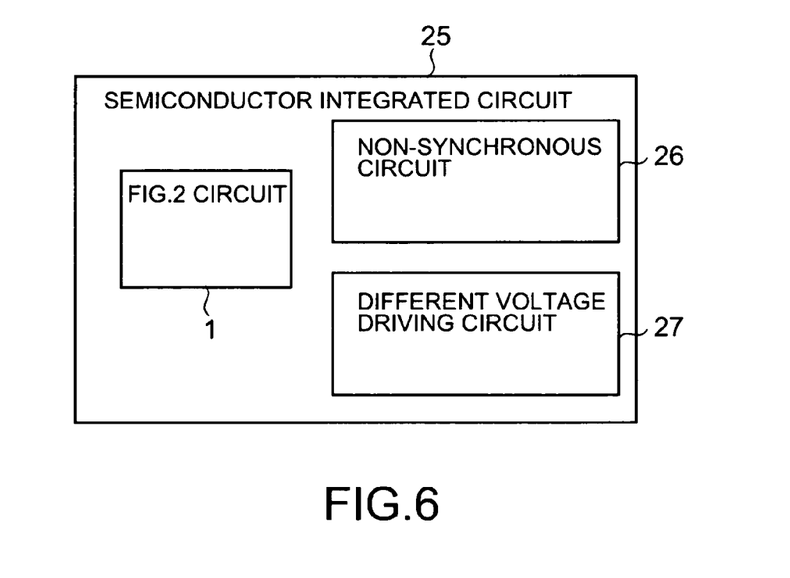
FIG. 6 is a block diagram illustrating one example of circuit structure according to a ninth embodiment.

The ninth embodiment illustrated in FIG. 6 is an example of a semiconductor integrated circuit 25 including the second embodiment of semiconductor integrated circuit 1 shown in FIG. 2 and a different circuit structure from that shown in FIG. 2. In FIG. 6, the semiconductor integrated circuit 25 includes the second embodiment of circuit 1 illustrated in FIG. 2, other non-synchronous circuit 26 and a circuit 27 driven by a different supply voltage. Even this semiconductor integrated circuit 25 that includes the different circuit structure becomes easy to test at least at the portion where the second embodiment of semiconductor integrated circuit shown in FIG. 2 exists if it is partially designed and tested using the design and test technique employed in the second embodiment of semiconductor integrated circuit shown in FIG. 2, and employing this design and test technique will alleviate difficulty in designing the semiconductor integrated circuit.

Tenth Embodiment

Figure 8:
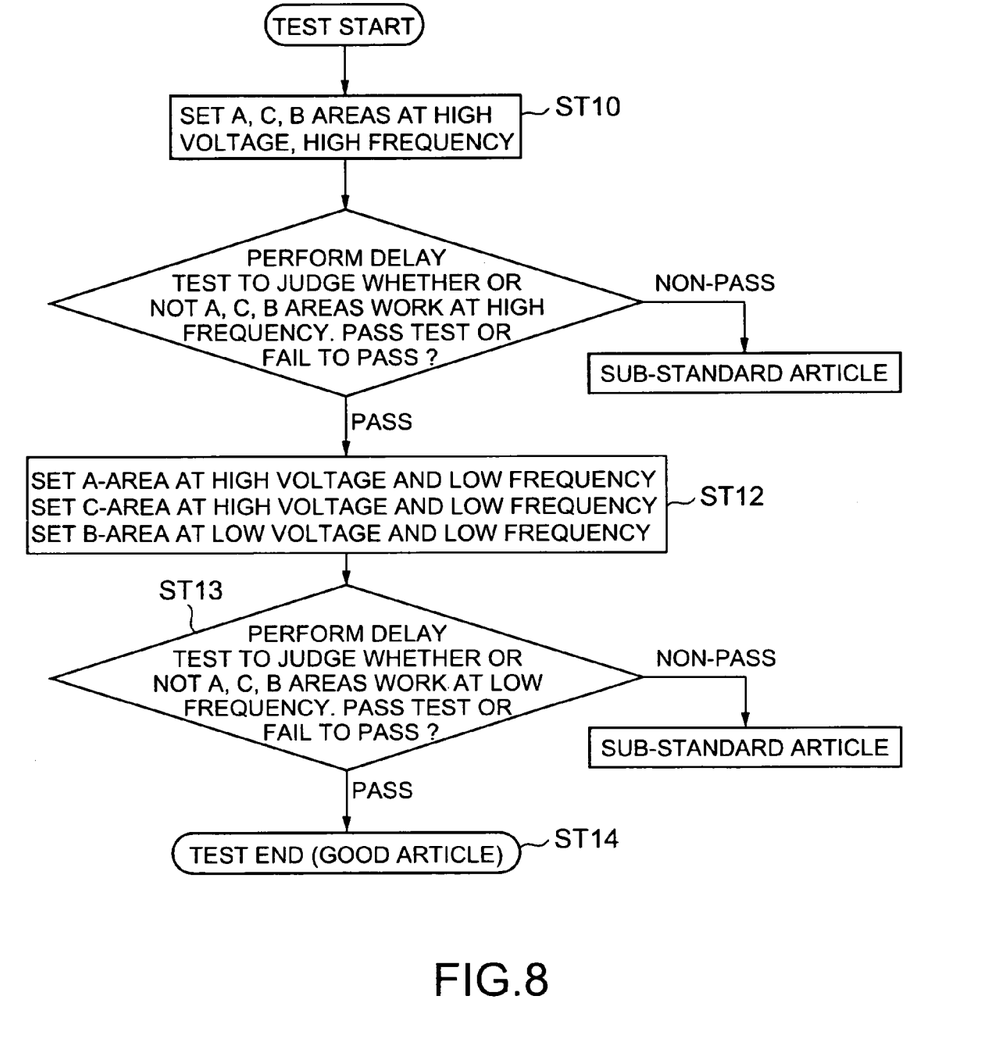
FIG. 8 is a flow chart illustrating flow of test according to the tenth embodiment.

The tenth embodiment relates to a method of testing delay of a semiconductor integrated circuit, and this method of testing delay is a design and method of testing delay of a semiconductor integrated circuit provided with a first area formed on a semiconductor chip and capable of operating at a predetermined first voltage and first frequency, and a second area formed on the semiconductor chip and capable of operating not only at a second voltage and a second frequency, which are lower than the first voltage and the first frequency, respectively, but also at the first voltage and the first frequency, and referring to the block diagram in FIG. 2 and the flow chart illustrated in FIG. 8, the method of testing delay of the semiconductor integrated circuit of this kind is described.

In FIG. 8, the test begins in step ST10 in which a tester sets the entire A, C, B areas at a constant high voltage and performs delay test with a high frequency. In brief, the tenth embodiment is derived from a view that performing delay tests under two test conditions, each having the entire interior of the semiconductor integrated circuit subjected to a single frequency, rather than testing delay of the semiconductor integrated circuits under two action conditions having the interior of the semiconductor integrated circuit subjected to different frequencies, allows test of a delay time at voltage boundary and a delay time at frequency boundary. The two action conditions include (1) a first action condition having the A-area subjected to a high voltage and a high frequency and having the C-area subjected to the high voltage and the high frequency; and having the C-area subjected to the high voltage and the high frequency and having the B-area subjected to the high voltage and the high frequency; and (2) a second action condition having the A-area subjected to the high voltage and the high frequency and having the C-area subjected to the high voltage and a low frequency; and having C-area subjected to the high voltage and the low frequency and having the B-area subjected to a low voltage and the low frequency. The two test conditions are (3) a first test condition having the A-area subjected to the high voltage and the high frequency and having the C-area subjected to the high voltage and the high frequency; and having the C-area subjected to the high voltage and the high frequency and having the B-area subjected to the high voltage and the high frequency; and (4) a second test condition having the A-area subjected to the high voltage and the low frequency and having the C-area subjected to the high voltage and the low frequency; and having the C-area subjected to the high voltage and the low frequency and having B-area subjected to a low voltage and the low frequency. The first action condition corresponds to the first test condition and is set in the step ST10. Further, test of a delay under the first test condition allows an omission of a delay test at the A-C boundary under the second action condition having the A-area subjected to the high voltage and the high frequency and having the C-area subjected to the high voltage and the low frequency. Reason why this omission is allowed is, as a logical conclusion, reason (1) that when both of the areas are subjected to the high voltage, a circuit having passed a delay test under hard condition of the high frequency will pass a delay test under less hard or soft condition of the low frequency.

Next, in order to perform, in step ST11, a delay test on the entire A, C, B areas, a delay test is performed using a pattern designed to have the entire interior of the semiconductor integrated circuit subjected to a single frequency. For example, a delay test utilizing a scan technique is considered. If it has failed to pass the scan test, the semiconductor integrated circuit is judged as a sub-standard article, while it has passed the scan test, the flow proceeds to step ST12. In step ST12, the before-mentioned second test condition has the A area subjected to the high voltage and the low frequency, the C area subjected to the high voltage and the low frequency, and the B area subjected to the low voltage and the low frequency, thereby to have the entire A, C, B areas subjected to the low frequency. As the A area and the A-C boundary have been scan tested at the high frequency, the before mentioned reason (1) makes it sure for the A area and the A-C boundary to operate at the high voltage and the low frequency. At this moment, in step ST12, the entire A, C, B areas are subjected to the low frequency, allowing delay test at a premise of the single frequency to be performed in step ST13. The test condition in step ST13 has the entire interior of the semiconductor integrated circuit subjected to a single frequency in the same manner as is so in step ST11, allowing the use of the same test pattern as used in ST11. Although, in step ST13, delay test of the C area and delay test of the B-C boundary under the action condition (2) are performed concurrently, such tests are allowed due to, as a logical conclusion, reason (2) that delay test can be performed by testing, at the single frequency, a delay within a circuit bridging different voltages if the circuit is designed to operate at a single delay value.

In step ST13, too, a delay (scan) test is performed on the entire A, C, B areas to judge whether or not the semiconductor integrated circuit passes the test. If it fails to pass the test, the semiconductor integrated circuit is judged as a sub-standard article, and if it passes the test, it is judged as a good article and the test comes to an end. In this manner, according to the tenth embodiment of test method, the action condition specified in step ST10 is set against an semiconductor integrated circuit as an article to perform an test, and the action condition specified in step ST12 is set against the semiconductor integrated circuit having past the test, and an test is performed using the same test pattern to judge whether or not the semiconductor is a sub-standard article.

Looking at the arrangement of three areas, A-area, B-area, C-area, shown in FIG. 2, the design technique for the above-mentioned semiconductor integrated circuit and the test technique of design data are described.

In FIG. 2, the semiconductor integrated circuit is designed such that, at the boundary between the A-area 2 provided as the first area and the B-area 3 provided as the second area, the C-area 4, which is provided as the intermediate or third area and acts in response to the first voltage and also to the second frequency in phase, is arranged. Next, routing of signals to be transmitted between the A-area 2 or the first area and the B-area 3 or the second are designed to pass through the C-area 4 or the third area. The semiconductor integrated circuit is designed such that the first register R1 and second register R2 are arranged beforehand as the delay analysis endpoint 4A capable of analyzing the first delay occurring between the A-area 2 provided as the first area and the C-area 4 provided as the third area and the second delay occurring between the B-area 3 provided as the second area and the C-area 4 provided as the third area. Upon performing delay test at the time of shipment, the delay test of the semiconductor integrated circuit is performed by utilizing the delay analysis endpoint 4A in the form of the first register R1 and the second register R2 to detect the first delay and the second delay.

Figure 7:
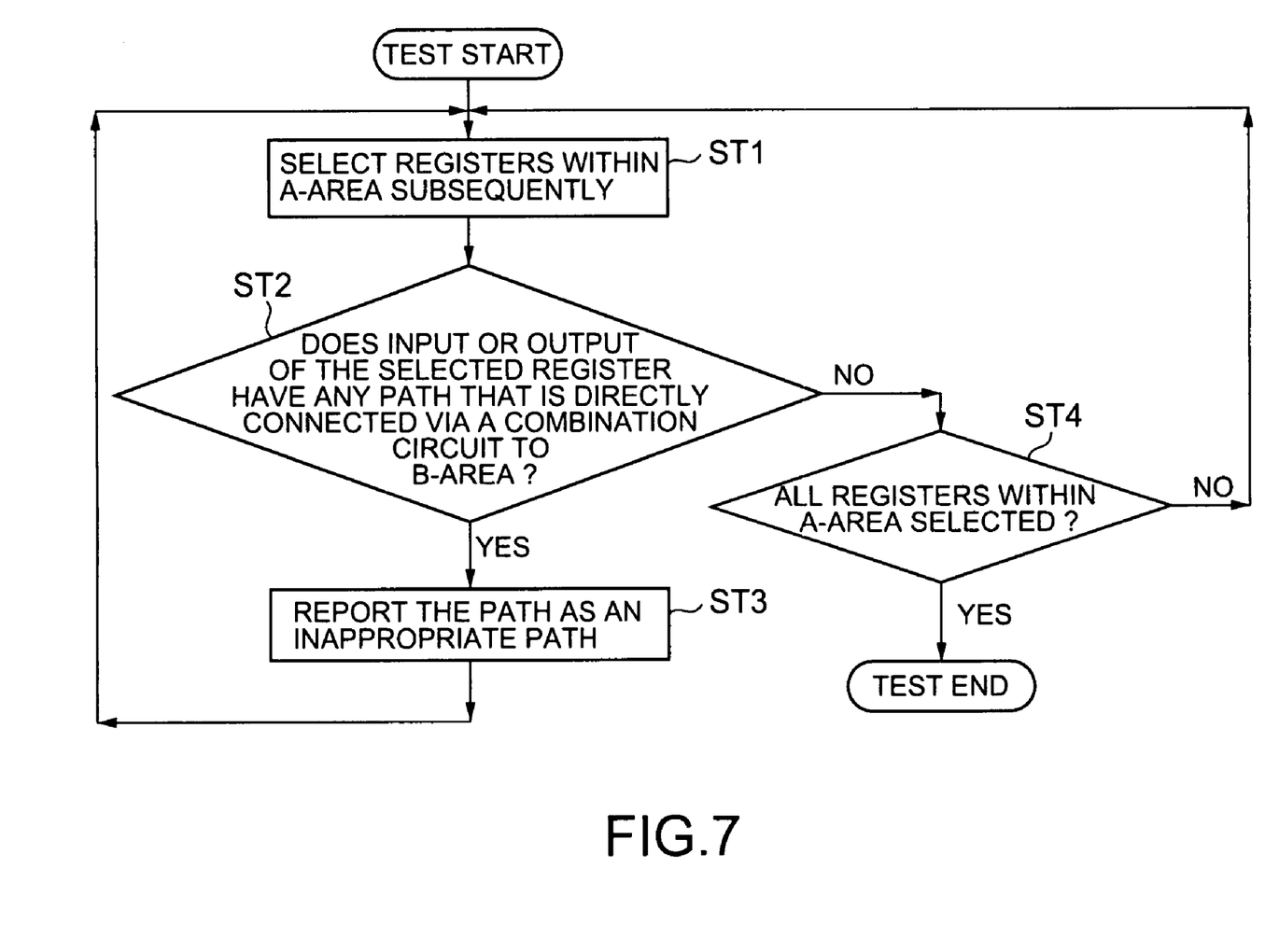
FIG. 7 is a flow chart illustrating one example of test algorithm according to a tenth embodiment.

Description is provided on algorithm to test whether or not this design technique is protected against design data upon designing the semiconductor integrated circuit. This algorithm aims at confirming that there are no paths given after the combination circuits have directly interconnected the A-area 2 and the B-area 3. Referring to FIG. 7, this algorithm is described. Performing test by CAD installed with this test algorithm allows confirmation of existence of every inappropriate path that makes it difficult to test delay in the stage of circuit design.

In FIG. 7, test of design data begins with selecting subsequently the third register 7 and the fourth register 8 within the A-area 2 in step ST1. Next, in step ST2, it is judged whether or not the input or output of the selected register within the A-area 2 has any path that is directly connected via a combination circuit to the registers R5, R6 within the B-area 3. If it is judged that there is a path of the above kind interconnecting the A-area 2 and the B-area 3, this path is reported as an inappropriate path in step ST3.

If, in step ST2, it is judged that there is no path that interconnects the A-area 2 and the B-area, it is judged in step ST4 whether or not all of the registers within the A-area have been selected, and if it is judged that all of the registers within the A-area have been selected, the test ends. If, in step ST4, it is judged that all of the registers R3, R4 have not been selected, tasks in the steps ST1 through ST4 are repeated, and if it is judged that all of the registers have been selected, the test ends.

By performing such test, a circuit designer can avoid an error in mixing an inappropriate path into the semiconductor integrated circuit. A person in charge of testing the design data can check the existence of a path having difficulty to test with the delay test at the time of shipment employing the technique according to the present application. In the Figures, the description made on the A-area may be replaced with the description on the B-area 3. Concrete test on each of every area can be performed for every individual semiconductor integrated circuit by relying on, for example, individual algorithm explained using FIG. 8 after applying test conditions explained before using FIGS. 2 and 7.

As explained before, since the C-area is provided as shown in FIG. 2, the test method according to the present application has made it possible to perform delay test at the CB boundary upon performing delay test on the C-area due to the logical conclusion reason (2) if, as demanded by the action condition (2), a scan test is performed across the CB boundary at which voltage changes and over the C-area and the B-area, which are subjected to a low frequency.

Next, if, arranging a frequency shifting area within a high voltage area, the above-described logical conclusion reason (1) is applied, a semiconductor integrated circuit that has passed a delay test with a hard high frequency will pass a delay test with a soft low frequency with the voltage condition kept constant, making it no longer necessary to perform a delay test across the AC boundary with the frequency modified, thus making it unnecessary to perform a field test by applying various conditions as being employed in the conventional circuit having A-B regions directly interconnected. Test at the time of shipment in frequency/voltage shift state can be performed with a delay test vector for action under the overall high voltage/high frequency. It is appreciated as an effect that since a test vector is automatically defined at the time of a scan test by a CAD, applying the scan test makes it easier as compared to an actual machine test to locate a trouble and analyze the trouble. It is also to be appreciated as an advantage that, according to the tenth embodiment, the number of times of an test decreases due to a reduction in the number of a test vector, and a semiconductor integrated circuit allows a CAD analysis alone to assure the content of an test.

Other Embodiments

In the above-described preceding embodiments, having explained a semiconductor integrated circuit provided with first through third areas and a delay test method for the semiconductor integrated circuit, the general concept of the semiconductor integrated circuit according to the present application may be applied to a circuit design for the semiconductor integrated circuit involving the general concept of the present application and also to a method of testing design of the semiconductor integrated circuit involving the general concept of the present application.

The above-described semiconductor integrated circuit and the test method reduce a test cost at the time of shifting upon mass production of semiconductor integrated circuits. Applying the present application as a technique for design circuits removes the complexity of circuit design and reduces a design cost of circuits.

What is claimed is:

1. A semiconductor integrated circuit comprising:
a first area, formed on a semiconductor chip, configured to operate at a first predetermined voltage and a first predetermined frequency;
a second area, formed on the semiconductor chip, configured to operate at a second voltage and a second frequency lower than the first voltage and the first frequency, respectively, and configured to be switched to operate at the first voltage and the first frequency; and
a third area, formed on the semiconductor chip, configured to operate at the first voltage and at a frequency which operates the second area and transmits and receives signals sent between the first area and the second area;
the third area possessing a delay analysis endpoint circuit configured to analyze each of a first delay occurring between the first area and the third area and a second delay occurring between the second area and the third area.

2. The semiconductor integrated circuit as claimed in claim 1,
wherein the delay analysis endpoint circuit possesses at least one of a first memory element that relays a signal path from the first area to the second area and a second memory element that relays a signal path from the second area to the first area.

3. The semiconductor integrated circuit as claimed in claim 2,
wherein the first area possesses a third memory element that memorizes a signal outputted from the first area toward the third area, and a fourth memory element that memorizes a signal inputted to the first area from the third area; and the second area possesses a fifth memory element that memorizes a signal inputted to the second area from the third area, and a sixth memory element that memorizes a signal outputted from the second area toward the third area, and further comprising:

a first combination circuit that is provided between the third memory element and the first memory element and between the second memory element and the fourth memory element, and combines input and output signals transmitted and received between the first area and the third area; and a second combination circuit that is provided between the first memory element and the fifth memory element and between the sixth memory element and the second memory element and combines input and output signals transmitted and received between the second area and the third area.

4. The semiconductor integrated circuit as claimed in claim 3,
wherein the second combination circuit possesses, at a boundary of a first voltage area and the second area that can change a voltage thereof, a voltage level shifter which is a group of an element that relays a signal path transmitted from the first voltage area to the second area and shifts a voltage level from the first voltage to a current voltage within the second area and an element that relays a signal path transmitted from the second area to the first voltage area and shifts a voltage level from the current voltage within the second area to the first voltage.

5. The semiconductor integrated circuit as claimed in claim 3, further comprising:
a first scan path so established as to include the third memory element within the first area and the fourth memory element; and a second scan path so established as to include the first memory element within the third area, the second memory element, the fifth memory element within the second area, and the sixth memory element.

6. The semiconductor integrated circuit as claimed in claim 2,
wherein the first area possesses a third memory element that memorizes a signal outputted from the first area toward the third area, a ninth memory element that memorizes a signal outputted from the first area toward the third area, a fourth memory element that memorizes a signal inputted to the first memory from the third area, and a tenth memory element that memorizes a signal inputted to the first area from the third area; and the third area possesses a seventh memory element that memorizes a signal inputted to the third area from the first area, and an eighth memory element that memorizes a signal outputted from the third area toward the first area, and further comprising:

a first combination circuit that is provided between the third memory element and the first memory element, between the second memory element and the fourth memory element, between the ninth memory element and the seventh memory element, and between the eighth memory element and the tenth memory element, and combines input and output signals transmitted and received between the first area and the third area; and a second combination circuit that is provided between outputs of the first and seventh memory elements and inputs to the second and eighth memory elements and the second area, and combines input and output signals transmitted and received between the second area and the third area.

7. The semiconductor integrated circuit as claimed in claim 2,
wherein each of the second area and the third area is divided into two areas, and a first voltage level shifter and a second voltage level shifter are provided between the divided two areas of the second area and the divided two areas of the third area, respectively.

8. The semiconductor integrated circuit as claimed in claim 1,
wherein the first voltage is a high voltage, the second voltage is a low voltage, the first frequency is a high frequency, and the second frequency is a low frequency.

9. The semiconductor integrated circuit as claimed in claim 1,
wherein the delay analysis endpoint circuit configured to analyze each of the first delay and the second delay is a memory element in the form of one of a flip-flop and a latch.

10. A computer-implemented method of delay testing a semiconductor integrated circuit, applied to a semiconductor integrated circuit including a first area, formed on a semiconductor chip, configured to operate at a first predetermined voltage and a first predetermined frequency; and a second area, formed on the semiconductor chip, configured to operate at a second voltage and a second frequency lower than the first voltage and the first frequency, respectively, and configured to be switched to operate at the first voltage and the first frequency; the method comprising:

providing a third area, formed on the semiconductor chip, configured to operate at the first voltage and a frequency which operates the second area and transmits and receives signals sent between the first area and the second area;

providing beforehand, within the third area, a delay analysis endpoint circuit configured to analyze each of a first delay occurring between the first area and the third area and a second delay occurring between the second area and the third area; and testing a delay of the semiconductor chip by detecting the first delay and the second delay with the delay analysis endpoint circuit.

11. The method of delay testing a semiconductor integrated circuit as claimed in claim 10, further comprising:
selecting one of a plurality of memory elements within the first area;
judging whether or not an input and an output of the selected memory element have any path that is directly connected via a combination circuit to a memory element within the second area;
detecting, if it is judged that there is a path that is directly connected via the combination circuit to the second area, the path as an inappropriate path;
selecting subsequently the remaining memory elements within the first area;
judging whether or not all of the memory elements within the first area have been selected; and
ending the test upon judgment that all of the memory elements within the first area have been selected.

12. The method of delay testing a semiconductor integrated circuit as claimed in claim 10, further comprising:

detecting a delay in a scan path by
performing a delay test at a high frequency with voltages of the first, second and third areas kept constant at a high voltage; and
performing a delay test at different voltages including a high voltage and a low voltage with frequencies of the third and second areas kept constant at a low frequency.

13. The method of delay testing a semiconductor integrated circuit as claimed in claim 12, further comprising:
performing a first delay test with the first, second and third areas kept at a high voltage and at a high frequency;
treating a semiconductor integrated circuit as a sub-standard article if the performed first delay test indicates a delay occurring within the semiconductor integrated circuit;
performing a second delay test with the first, second and third areas kept at a low frequency and with the third and second areas kept at a high voltage and at a low voltage, respectively, if the semiconductor integrated circuit has past the first delay test;
treating the semiconductor integrated circuit as a sub-standard article if the performed second delay test indicates a delay occurring within the semiconductor integrated circuit; and
judging the semiconductor integrated circuit as a good article if the semiconductor integrated circuit has past the second delay test.

14. The method of delay testing a semiconductor integrated circuit as claimed in claim 13,
wherein the first delay test performed with the first, second and third kept at the high voltage and at the high frequency is performed using a first combination circuit serving as a signal period between first and second memory elements that are provided as the delay analysis endpoint circuit within the third area and the first area; and
wherein the second delay test performed between the third and second areas is performed using a second combination circuit serving as a signal period between the first and second memory elements and the second area.

15. The method of delay testing a semiconductor integrated circuit as claimed in claim 13,
wherein an test vector used in the first delay test is and an test vector used in the second delay test are different.

16. The method of delay testing a semiconductor integrated circuit as claimed in claim 13,
wherein the first area has formed therein a first scan path for the first delay test; and the second and third areas have formed therein a second scan path for the second delay test.

* * * * *